(12) United States Patent
Yoon

(10) Patent No.: US 6,984,539 B2
(45) Date of Patent: Jan. 10, 2006

(54) METHOD OF MANUFACTURING LIGHT-EMITTING DIODE DEVICE

(75) Inventor: Joon Ho Yoon, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 121 days.

(21) Appl. No.: 10/617,727

(22) Filed: Jul. 14, 2003

(65) Prior Publication Data

US 2004/0248332 A1 Dec. 9, 2004

(30) Foreign Application Priority Data

Jun. 3, 2003 (KR) .................... 10-2003-0035707

(51) Int. Cl.
*H01L 21/00* (2006.01)
*H01L 21/48* (2006.01)
(52) U.S. Cl. ........................ 438/29; 438/35; 438/112
(58) Field of Classification Search .................. 438/35, 438/106, 107, 112, 113
See application file for complete search history.

(56) References Cited

U.S. PATENT DOCUMENTS 6,274,924 B1 8/2001 Carey et al.
6,291,274 B1 * 9/2001 Oida et al. .................. 438/123
6,680,568 B2 * 1/2004 Fujiwara et al. ............ 313/501
2003/0025450 A1 * 2/2003 Katayama et al. .......... 313/512

FOREIGN PATENT DOCUMENTS

JP 06-204569 * 7/1994
JP 2000-269556 * 9/2000

* cited by examiner

*Primary Examiner*—Mary Wilczewski
*Assistant Examiner*—Pamela E Perkins
(74) *Attorney, Agent, or Firm*—Lowe Hauptman & Berner, LLP

(57) ABSTRACT

A method of manufacturing a light-emitting diode (LED) device includes forming a lead frame having a first pattern part mounted with an LED chip, a second pattern part electrically connected to the first pattern part to be used as an electrode, a third pattern part spaced from the first pattern part to be electrically insulated from the first pattern part and used as another electrode, and a fourth pattern part and a fifth pattern part integrated with both sides of the first pattern part, forming a layer plated with a metal having high reflectivity on the fourth and fifth pattern parts, and upwardly folding the fourth and fifth pattern parts to be perpendicular to the first pattern part to form reflective surfaces.

11 Claims, 5 Drawing Sheets

METHOD OF MANUFACTURING LIGHT-EMITTING DIODE DEVICE

BACKGROUND OF THE INVENTION

1. Field of the Invention

The present invention relates, in general, to surface mountable light-emitting diode devices. More specifically, the present invention is directed to a method of manufacturing a light-emitting diode device, capable of simply forming reflective surfaces made of a metal material by use of a lead frame.

2. Description of the Related Art

As well known to those skilled in the art, a light-emitting diode (hereinafter, referred to as 'LED') composed of a compound semiconductor, such as GaAs, AlGaAs, GaN, InGaN or AlGaInP, as a light-emitting source, is a semiconductor device capable of emitting light of various colors.

With great advances in semiconductor techniques, LED devices have recently been produced to have high luminance and quality characteristics, in place of commercially available LED products with low luminance. In addition, fabrication of blue and white diodes has been practically realized, whereby the LEDs are widely applicable to displays, next-generation lighting sources and the like. For instance, a surface mountable LED device is available.

FIG. 1 schematically shows the surface mountable LED device, comprising a package molded with an epoxy resin. A certain surface of the package 2 is formed to an open window 4 so as to easily emit light, and the other surfaces are attached with electrodes 5 so as to be mounted in a printed circuit board 1. In the package 2, a light-emitting surface of an LED chip is disposed to face to the light-emitting window 4, and the electrodes 5 are connected with the LED chip by a wire.

Factors determining the characteristics of the LED device include color, luminance, strength of luminance, etc. While the characteristics of such an LED device mainly depend on a compound semiconductor material used for the LED chip, they are further affected by a structure of the package for use in mounting the LED chip. The LED package structure has an influence on luminance and luminance angle distributions.

The surface mountable LED package suffers from low luminance due to a broad luminance distribution.

FIG. 2 shows a structure of a conventional surface mountable LED device. As shown in FIG. 2, the LED device comprises a lead frame 21, a package 22 formed by a pre-molding process to contain a portion of the lead frame 21, an LED chip 23 mounted on the lead frame 21 in the package 22, and a molding material 25 filled in the package 22 to protect the LED chip 23.

With reference to FIGS. 3a through 3e, there is shown a process of manufacturing such a conventional LED device, comprising forming a lead frame (FIG. 3a), plating (FIG. 3b), pre-molding (FIG. 3c), mounting a chip and wire-bonding (FIG. 3d), and filling epoxy (FIG. 3e). In such a case, the lead frame 31 includes a first pattern part 31a for use in mounting an LED chip thereon, a second pattern part 31b integrated with the first pattern part 31a for use in an electrode, and a third pattern part 31c spaced from the first pattern part 31a so as to be electrically insulated from the first pattern part 31a. On a front surface of the lead frame 31, a metal-plated layer 32 having high adhesion and conductivity is formed to easily perform a wire-bonding process. In FIG. 3c illustrating the pre-molded state, a hexahedron-shaped package 33 having an inner cavity is formed to surround the other portions of the lead frame 31 with the exception of electrode portions of the second and third pattern parts 31b and 31c of the lead frame 31 to be used as external electrodes. An LED chip 34 is mounted on the first pattern part 31a of the lead frame 31 in the package 33, and the LED chip 34 is wire-bonded to each of the second and third pattern parts 31b and 31c in the package 33 to form wire-bonded portions. As shown in FIG. 3e, the package 33 is filled with transparent epoxy 36 to protect the LED chip 34 and the wire-bonded portions.

However, such an LED device is disadvantageous in terms of characteristic deterioration and decreased functions, resulting from defects of crystals caused by artificial growth in the compound semiconductor, serving as the emitting source. Further, packaging and transparent molding materials may be degraded in characteristics thereof, too.

As seen in FIG. 2 and FIGS. 3a through 3e, the conventional LED device is low in reflection efficiency, since a plastic material is used at the pre-molding process. Also, upon use of such a device for extended periods, deterioration of the pre-molded package takes place as in molding materials, thus significantly lowering luminance characteristics.

Moreover, the pre-molded package has low thermal conductivity, and is restricted for use in products with high luminance. Additionally, upon emission of light from the LED chip, inner surfaces of the package useful as a light-emission passage are non-uniform, thus lowering reflection efficiency.

SUMMARY OF THE INVENTION

Accordingly, the object of the present invention is to alleviate the problems encountered in the related art and to provide a method of manufacturing a light-emitting diode device, characterized by simply forming metal material reflective surfaces by use of a lead frame, therefore resulting in improving the luminance characteristics by a simple manufacturing process.

To achieve the above object, there is provided a method of manufacturing an LED device according to a primary embodiment of the present invention, comprising the steps of forming a lead frame including a first pattern part mounted with an LED chip, a second pattern part electrically connected to the first pattern part to be used as an electrode, a third pattern part spaced from the first pattern part to be electrically insulated from the first pattern part and used as another electrode, a fourth pattern part and a fifth pattern part integrated with both sides of the first pattern part; forming a metal-plated layer having high adhesion and conductivity on the first pattern part through the third pattern part of the lead frame; forming another metal-plated layer having high reflectivity on the fourth and fifth pattern parts; mounting the LED chip on the plated first pattern part to emit light upward; connecting the mounted LED chip to the second and third pattern parts by means of a wire; molding the mounted LED chip and the portions connected by the wire for protection thereof; upwardly folding the fourth and fifth pattern parts to be perpendicular to the first pattern part of the lead frame to allow plated surfaces of the fourth and fifth pattern parts to face each other; and forming externally exposed portions of the second and third pattern parts to make external electrodes. Thereby, reflective surfaces can be easily formed with a desired metal-plated layer, and thus the luminance characteristics of the LED device can be further improved.

According to a secondary embodiment of the present invention, there is provided a method of manufacturing an LED device, comprising the steps of: forming a lead frame including a first pattern part mounted with an LED chip, a second pattern part electrically connected to the first pattern part to be used as an electrode, a third pattern part spaced from the first pattern part to be electrically insulated from the first pattern part and used as another electrode, a fourth pattern part and a fifth pattern part integrated with both sides of the first pattern part; forming a metal-plated layer having high adhesion and conductivity on the first pattern part through the third pattern part of the lead frame; forming another metal-plated layer having high reflectivity on the fourth pattern part and the fifth pattern part of the lead frame; upwardly folding the plated fourth pattern part and the plated fifth pattern part to be perpendicular to the first pattern part of the lead frame to allow plated surfaces of the fourth and fifth pattern parts to face each other; pre-molding the lead frame to surround all the other parts of the lead frame with the exception of electrode portions of the second and third pattern parts, to form a hexahedron-shaped package having an inner cavity; mounting the LED chip on the plated first pattern part of the lead frame surrounded by the package so as to emit light upward; wire-bonding the mounted LED chip to each of the second pattern part and the third pattern part in the package to form wire-bonded portions; molding the inside of the package to protect the LED chip and the wire-bonded portions; and forming the electrode portions of the second and third pattern parts to make leads. As a result, reflective surfaces can be easily formed with a desired metal-plated layer, and the luminance characteristics can be further improved.

As for the manufacturing method of the LED device, the plated layer of each of the fourth pattern part and the fifth pattern part of the lead frame is composed of Ag, Ni, Pd or Cr, and the plated layer of each of the first pattern part through the third pattern part of the lead frame is composed of Ag, Au or Pd.

In addition, as for the manufacturing method of the LED device, the upwardly folding step further comprises the step of controlling reflection angles by adjusting angles between the first pattern part and the fourth pattern part and between the first pattern part and the fifth pattern part, thereby obtaining a desired reflection angle.

BRIEF DESCRIPTION OF THE DRAWINGS

The above and other objects, features and other advantages of the present invention will be better understood from the following detailed description taken in conjunction with the accompanying drawings, in which:

FIGS. 6a through 6b are views illustrating a modification of the manufacturing process of the light-emitting diode device according to the secondary embodiment of the present invention.

DETAILED DESCRIPTION OF THE INVENTION

Based on the present invention, a method of manufacturing an LED device according to a mold type or a pre-mold type is provided, to easily and simply form reflective surfaces by use of a lead frame, in which a manufacturing method of a mold type LED device differs in procedures thereof from that of a pre-mold type LED device.

Figure 1:
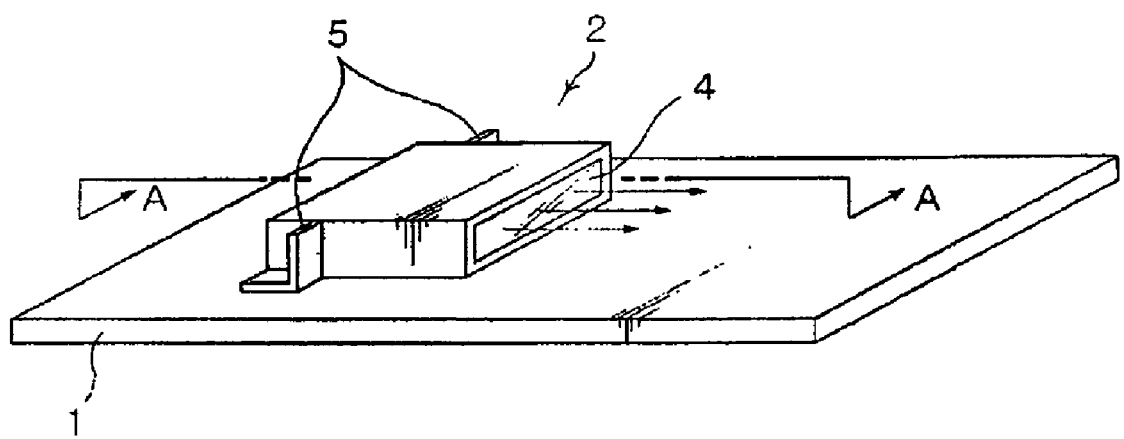
FIG. 1 is a schematic view illustrating a general light-emitting diode device.
Figure 2:
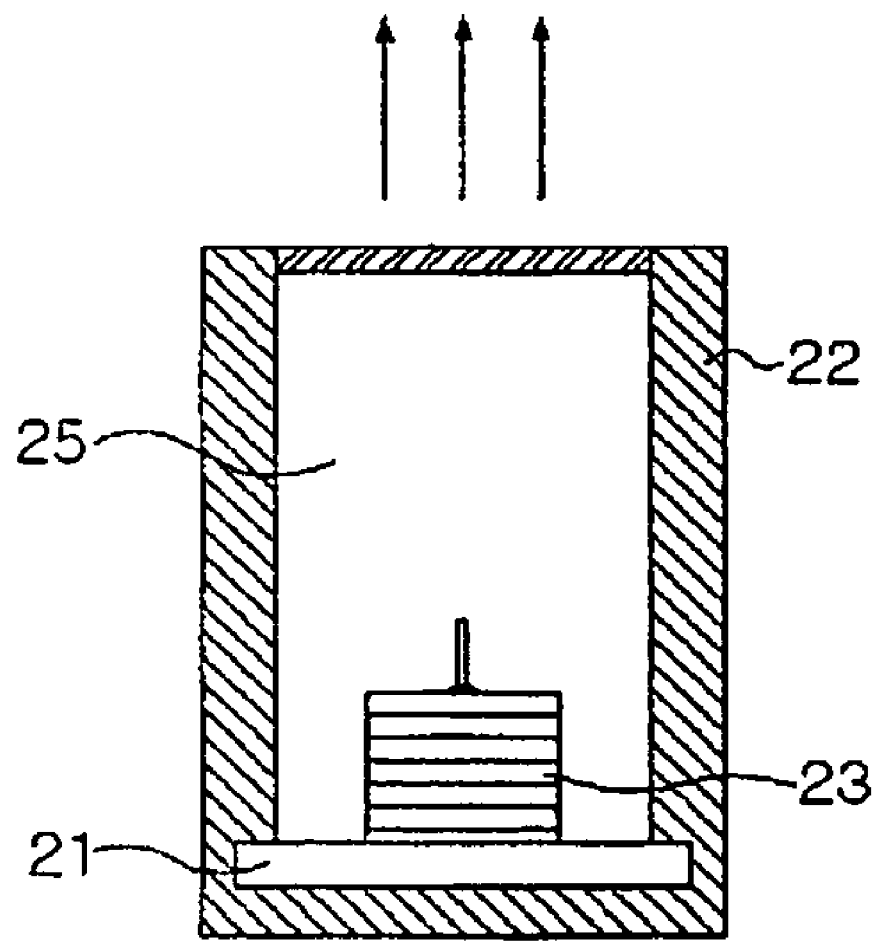
FIG. 2 is a sectional view illustrating a structure of a conventional light-emitting diode device.
Figure 3:
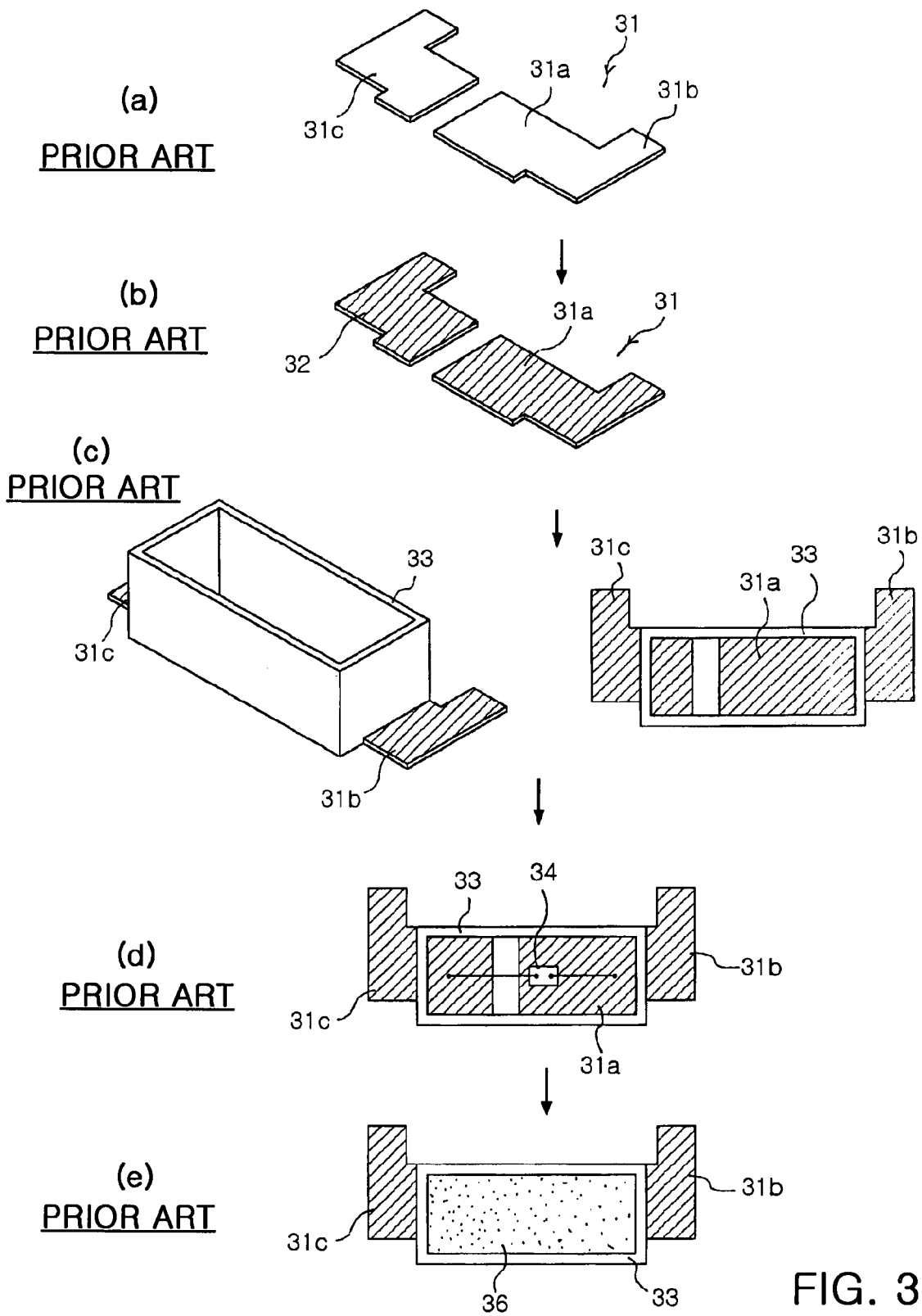
FIGS. 3a through 3e are views illustrating a manufacturing process of such a conventional light-emitting diode device.
Figure 4:
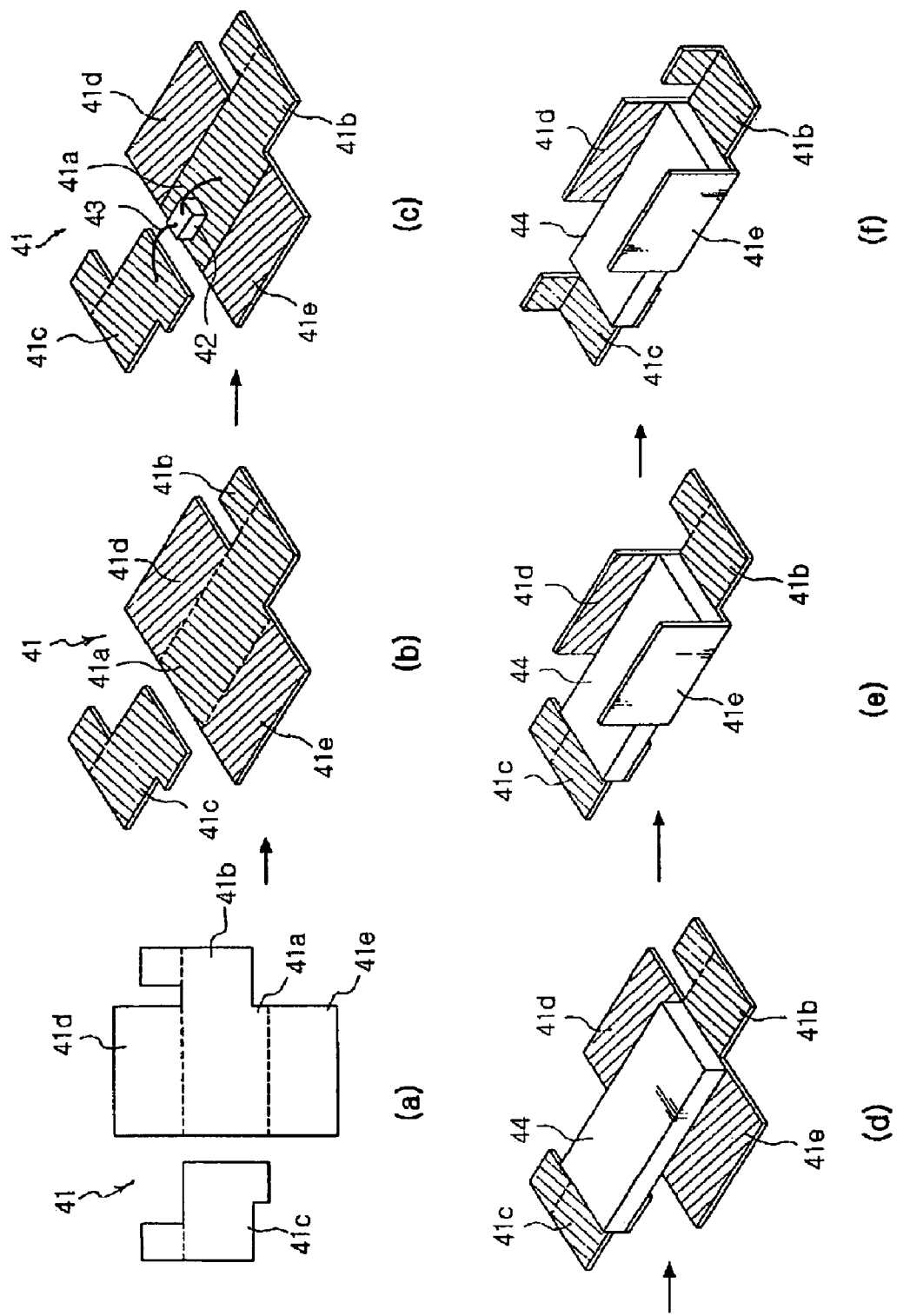
FIGS. 4a through 4f are views illustrating a manufacturing process of a light-emitting diode device, according to a primary embodiment of the present invention.

Referring to FIG. 4, there is sequentially shown a process of manufacturing the mold type LED device, according to a primary embodiment of the present invention.

The mold type LED device forms a package structure by a molding process directly without a pre-molding process, and is fabricated by the following procedures.

As shown in FIG. 4a, a lead frame 41 is formed for supporting an LED chip and forming electrodes for electric signal applications. As such, the lead frame 41 comprises a first pattern part 41a for use in mounting an LED chip thereon, a second pattern part 41b electrically connected to the first pattern part 41a to be used as an external lead electrode, a third pattern part 41c spaced from the first pattern part 41a to be electrically insulated from the first pattern part 41a and used as another external lead electrode, a fourth pattern part 41d and a fifth pattern part 41e integrated with both sides of the first pattern part 41a.

The fourth and fifth pattern parts 41d and 41e of the lead frame 41 are folded upward to be perpendicular to the first pattern part 41a, and function to concentrate rays of light emitted from the LED chip to a predetermined direction.

With the aim of maximizing the reflection effects of light in a desired direction, the fourth and fifth pattern parts 41d and 41e are disposed to face each other at both sides of the first pattern part 41a, and, preferably, have a size suitable for reflecting the light emitted from the LED chip to be mounted onto the first pattern part 41a.

Further, such pattern parts for reflection of light may be formed to be coincident with lengths of both sides of the first pattern part 41a, and the other sides of the first pattern part 41a are formed with electrode parts, thus easily mounting the LED chip on the first pattern part 41a.

After such a lead frame 41 is formed, a front surface thereof is plated. FIG. 4b shows the plated lead frame 41, in which each pattern part of the lead frame 41 may be plated with different metals according to functions of each pattern part. In the present invention, the first pattern part 41a through the third pattern part 41c, which are mounted with the LED chip and subjected to a wire-bonding process, are plated with a metal having high conductivity and adhesion, such as Ag, Au, Pd and so on. Meanwhile, the fourth and fifth pattern parts 41d and 41e, serving as a reflective surface, are plated with a metal that is glossy and has high reflectivity, such as Ag, Ni, Pd, Cr, etc.

Since a pre-molding process is unnecessary for the mold type LED device, the plated lead frame 41 is directly mounted with the LED chip 42 at a plated surface thereof. Electrodes of the LED chip 42 are bonded to the second and third pattern parts 41b and 41c of the plated lead frame 41 by means of a wire 43, to form wire-bonded portions. FIG. 4c shows the mounted LED chip 42 and the wire-bonded lead frame 41.

Then, a circumference of the LED chip 42 and the bonded wire 43 mounted on the lead frame 41 is molded to a predetermined shape for protection thereof. As shown in FIG. 4d, a hexahedron-shaped molding part 44 having parallel surfaces is formed so that the LED device is easily mounted. In addition, such a molding part 44 may be formed to other shapes.

A constituent material of the molding part 44 comprises transparent epoxy with high light transmittance so that light emitted from the LED chip 42 is almost completely transmitted. Alternatively, other materials may be used so long as satisfying the above requirements of the molding material.

In the state of the LED chip 42 and the wire-bonded portions being protected by the molding part 44, the fourth and fifth pattern parts 41d and 41e of the plated lead frame 41 are folded upward to be perpendicular to the first pattern part 41a of the lead frame 41. Thereby, the plated surfaces of the fourth pattern part 41d and the fifth pattern part 41e are disposed to be opposite, each of which is plated with a metal having high reflectivity.

Hence, light emitted from the LED chip 42 is reflected on the plated surfaces of the fourth and fifth patterns parts 41d and 41e, and concentrated to a predetermined direction while not being externally transmitted, and then radiated. Thus, luminance characteristics of light emitted from the complete LED device can be improved.

Such characteristics can be applied to a pre-mold type LED device.

Turning now to FIGS. 5a through 5f, there is sequentially shown a process of manufacturing the pre-mold type LED device according to the secondary embodiment of the present invention.

Likewise, a lead frame 51 is formed for supporting an LED chip and forming electrodes for electric signal applications. Such a lead frame 51 includes a first pattern part 51a for use in mounting an LED chip thereon, a second pattern part 51b electrically connected to the first pattern part 51a to be used as an external lead electrode, a third pattern part 51c spaced from the first pattern part 51a to be electrically insulated from the first pattern part 51a and used as another external lead electrode, a fourth pattern part 51d and a fifth pattern part 51e integrated with both sides of the first pattern part 51a. At this time, the first pattern part 51a through the third pattern part 51c are plated with a metal having high conductivity and adhesion, and the fourth and fifth pattern parts 51d and 51e are plated with another metal that is glossy and has high reflectivity.

Figure 5:
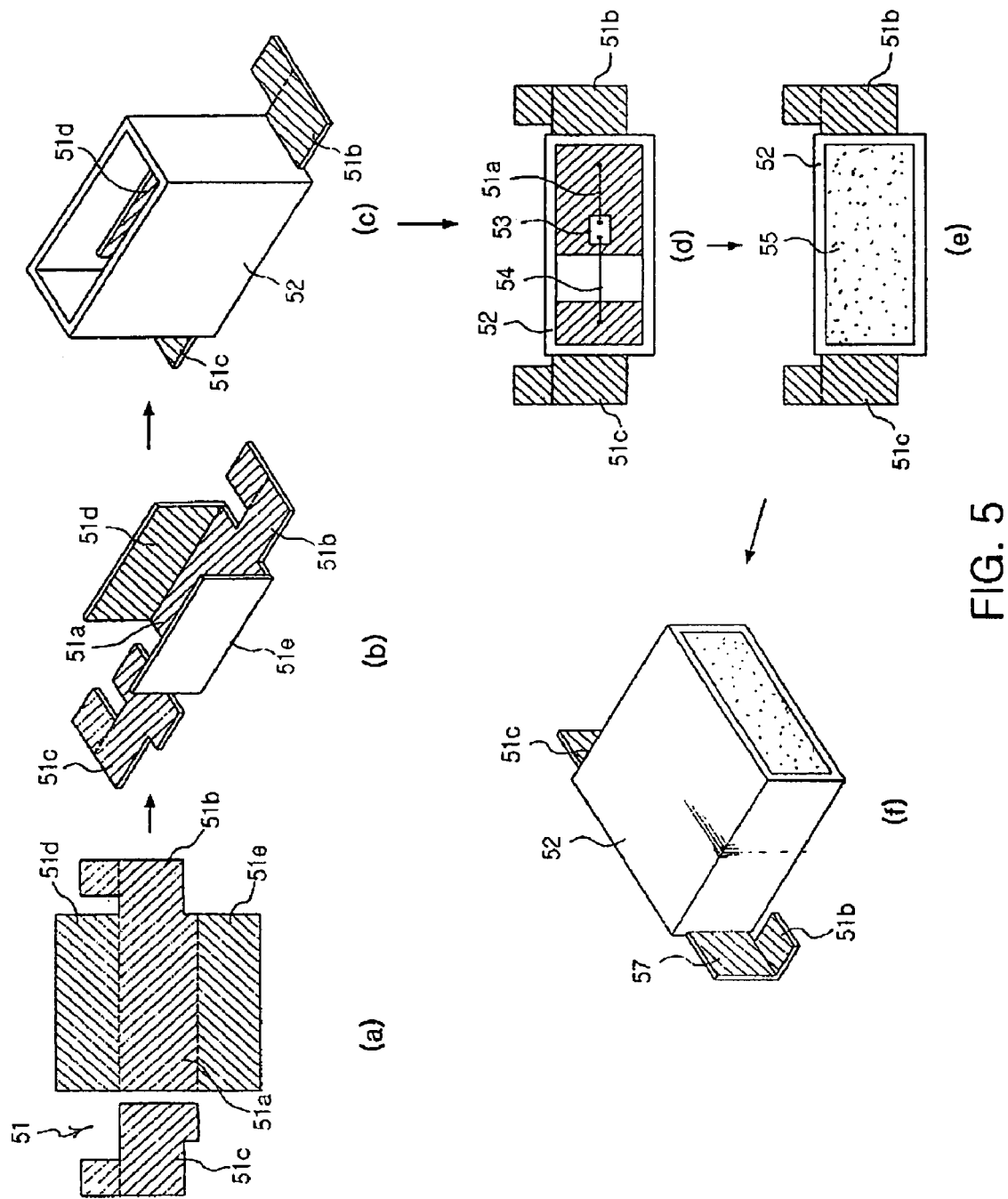
FIGS. 5a through 5f are views illustrating a manufacturing process of a light-emitting diode device, according to a secondary embodiment of the present invention.

FIG. 5a shows a plated lead frame 51 having the above pattern parts.

The fourth and fifth pattern parts 51d and 51e of the lead frame 51 are folded upward to be perpendicular to the first pattern part 51a, and function to concentrate rays of light emitted from an LED chip 53 in a predetermined direction. As such, in order to maximally obtain the reflection effects of light in a desired direction, the fourth and fifth pattern parts 51d and 51e are disposed to face each other at both sides of the first pattern part 51a, and have a size suitable for reflecting light emitted from the LED chip 53 to be mounted onto the first pattern part 51a.

In case of the pre-mold type, the fourth pattern part 51d and the fifth pattern part 51e of the plated lead frame 51 are folded upward to be perpendicular to the first pattern part 51a of the lead frame 51, as shown in FIG. 5b. That is, reflective surfaces are formed before performing a molding process.

Thereafter, a package structure 52 is formed to surround all the other portions of the reflective surfaces-formed lead frame 51 with the exception of only electrode portions of the second and third pattern parts 51b and 51c to be used as the external lead electrodes, for example, the first pattern part 51a, the wire-bonded portions of the second and third pattern parts 51b and 51c, and the fourth and fifth pattern parts 51d and 51e perpendicularly folded upward relative to the first pattern part 51a, by means of a pre-molding process. As such, the package structure 52 formed by the pre-molding process is in the form of hexahedron having an inner cavity to easily mount a desirable target therein, in which a surface facing to the first pattern part 51a is opened. FIG. 5c shows the pre-molded package 52.

As shown in FIG. 5d, an LED chip 53 is mounted onto the plated surface of the first pattern part 51a in the package 52, and the LED chip 53 is connected to each of the second and third pattern parts 51b and 51c by means of a wire 54 in the package 52.

Then, the package 52 is filled with transparent epoxy 55 (FIG. 5e) as in a conventional pre-molding process. The externally exposed electrode portions of the second and third pattern parts 51b and 51c of the lead frame 51 are vertically folded to make mountable electrode structures, thereby manufacturing a pre-mold type LED device (FIG. 5f).

To the conventional manufacturing process of the pre-mold type LED, the process of forming reflective surfaces after the lead frame is changed in only a shape thereof is further added according to the secondary embodiment. Thereby, it is possible to simply form the reflective surfaces plated with the metal having high reflectivity within the pre-molded package 52. Eventually, the luminance of the LED device can be increased.

Upon manufacturing the LED devices according to the primary and secondary embodiments of the present invention, the angles between the first pattern parts 41a and 51a, and the fourth pattern parts 41d and 51d and the fifth pattern parts 41e and 51e are controlled, thus obtaining the desired reflection angles.

Alternatively, the shape of the above lead frame is changed, and thus the reflective surfaces may be formed to all four surfaces surrounding the LED chip.

FIG. 6a shows a lead frame having a shape different from the lead frame of FIG. 5a. In such a case, the lead frame 61 comprises a first pattern part 61a for use in mounting an LED chip thereon, a second pattern part 61b electrically connected to the first pattern part 61a to be used as an external lead electrode, a third pattern part 61c spaced from the first pattern part 61a to be electrically insulated from the first pattern part 61a and used as another external lead electrode, a fourth pattern part 61d and a fifth pattern part 61e integrated with both sides of the first pattern part 51a. In addition, the lead frame 61 further includes a sixth pattern part 61f positioned between the first pattern part 61a and the second pattern part 61b to electrically connect the two pattern parts 61a and 61b, and a seventh pattern part 61g positioned between the first pattern part 61a and the third pattern part 61c.

The seventh pattern part 61g is electrically connected to either the first pattern part 61a or the third pattern part 61c, or to neither the first pattern part 61a nor the third pattern part 61c.

The sixth and seventh pattern parts 61f and 61g are plated with a metal having high reflectivity as in the fourth and fifth pattern parts 61d and 61e, and the second and third pattern parts 61b and 61c used for LED chip mounting and wire bonding are plated with a metal having good soldering characteristics.

FIG. 6b shows reflective surfaces formed by the lead frame shown in FIG. 6a.

That is, the fourth pattern part 61d through the seventh pattern part 61g are perpendicularly folded upward relative to the first pattern part 61a, thus forming two pairs of opposite surfaces. In addition, the second and third pattern parts 61b and 61c are folded to be perpendicular to the sixth and seventh pattern parts 61f and 61g, and positioned parallel to the first pattern part 61a.

As such, on the plated surface of the first pattern part 61a surrounded by the fourth pattern part 61d through the seventh pattern part 61g, the LED chip is mountable. Thereby, light emitted from the LED chip is reflected on four reflective surfaces formed by the fourth pattern part 61d through the seventh pattern part 61g, and then radiated in a predetermined direction.

The more the reflective surfaces, the higher the reflection effects.

The LED device is manufactured by use of the lead frame having the shape of FIG. 6a, according to the same manufacturing procedures of the primary and secondary embodiments of the present invention.

As described above, the present invention provides a method of manufacturing the LED device having reflective surfaces made of a metal material by use of the lead frame, in which the metal material can be freely selected from among metals having high reflectivity. In particular, portions of the lead frame functioning as a "heat sink" are used to form reflective surfaces, which increases the release of heat, thereby preventing the deterioration of the luminance characteristics. Further, in the lead frame, angles between the pattern parts are adjusted, whereby reflection angles are controllable, thus easily controlling the angles of the light to be emitted. Furthermore, uniform reflective films can be formed on the reflective surfaces.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a light-emitting diode device, comprising the following steps of:
    forming a lead frame including
        a first pattern part for use in mounting a light-emitting diode chip thereon,
        a second pattern part electrically connected to the first pattern part to be used as an electrode,
        a third pattern part spaced from the first pattern part to be electrically insulated from the first pattern part and used as another electrode, and
        a fourth pattern part and a fifth pattern part integrated with both sides of the first pattern part;
    plating the first, second and third pattern parts of the lead frame with a metal having high adhesion and conductivity, to prepare a plated first pattern part, a plated second pattern part, and a plated third pattern part;
    plating the fourth pattern part and the fifth pattern part with another metal having high reflectivity, to prepare plated fourth and fifth pattern parts;
    mounting the light-emitting diode chip on the plated first pattern part of the lead frame;
    wire-bonding the light-emitting diode chip mounted on the lead frame to portions of the second and third pattern parts, to form wire-bonded portions;
    molding the light-emitting diode chip and the wire-bonded portions so as to protect the light-emitting diode chip and the wire-bonded portions;
    upwardly folding the plated fourth and fifth pattern parts, neither being molded, relative to the first pattern part to allow plated surfaces of the fourth and fifth pattern parts to face each other, thus forming reflective surfaces; and
    forming non-molded portions of the second and third pattern parts to make leads.

2. The method as defined in claim 1, wherein the fourth pattern part and the fifth pattern part of the lead frame are plated with Ag, Ni, Pd or Cr.

3. The method as defined in claim 1, wherein the first, second and third pattern parts of the lead frame are plated with Ag, Au or Pd.

4. The method as defined in claim 1, wherein the upwardly folding step further comprises the step of controlling reflection angles of light by adjusting angles between the first pattern part and each of the fourth and fifth pattern parts.

5. The method as defined in claim 1, wherein a molding material used at the molding step is transparent epoxy.

6. A method of manufacturing a light-emitting diode device, comprising the following steps of:
    forming a lead frame including
        a first pattern part for use in mounting a light-emitting diode chip thereon,
        a second pattern part electrically connected to the first pattern part to be used as an electrode,
        a third pattern part spaced from the first pattern part to be electrically insulated from the first pattern part and used as another electrode, and
        a fourth pattern part and a fifth pattern part integrated with both sides of the first pattern part;
    plating the first, second and third pattern parts of the lead frame with a metal having high adhesion and conductivity, to prepare a plated first pattern part, a plated second pattern part, and a plated third pattern part;
    plating the fourth pattern part and the fifth pattern part of the lead frame with another metal having high reflectivity, to prepare a plated fourth pattern part and a plated fifth pattern part;
    upwardly folding the plated fourth pattern part and the plated fifth pattern part of the lead frame relative to the first pattern part to allow plated surfaces of the fourth and fifth pattern parts to face each other, thus forming reflective surfaces;
    pre-molding the first pattern part, the upwardly folded fourth and fifth pattern parts, and portions of the second and third pattern parts to be surrounded while the other portions of the second and third pattern parts are externally exposed, thus forming a package;
    mounting the light-emitting diode chip on the plated first pattern part in the package so that a light-emitting surface of the light-emitting diode chip faces upward;
    wire-bonding the light-emitting diode chip to each of the second pattern part and the third pattern part in the package, to form wire-bonded portions;
    molding the inside of the package to protect the light-emitting diode chip and the wire-bonded portions; and
    forming the other portions of the second and third pattern parts exposed outside the package to make leads.

7. The method as defined in claim 6, wherein the fourth pattern part and the fifth pattern part of the lead frame are plated with Ag, Ni, Pd or Cr.

8. The method as defined in claim 6, wherein the first, second and third pattern parts of the lead frame are plated with Ag, Au or Pd.

9. The method as defined in claim 6, wherein the upwardly folding step further comprises the step of controlling reflection angles of light by adjusting angles between the first pattern part and each of the fourth and fifth pattern parts of the lead frame.

10. The method as defined in claim 6, wherein a molding material used at the molding step is transparent epoxy.

11. The method as defined in claim 6, wherein the package formed at the pre-molding step is made of non-transmittable plastic materials.

* * * * *